United States Patent
Tanaka et al.

[11] Patent Number: 5,934,368
[45] Date of Patent: Aug. 10, 1999

[54] AIR-COOLED ELECTRONIC APPARATUS WITH CONDENSATION PREVENTION

[75] Inventors: Tetsuya Tanaka, Ibaraki-ken; Toshio Hatada; Takayuki Atarashi, both of Tsuchiura; Junichi Kobayashi, Ushiku; Akihiro Takanashi, Kokubunji; Takahiro Daikoku, Ushiku; Yutaka Watanabe; Shizuo Zushi, both of Hadano, all of Japan

[73] Assignee: Hitachi, Ltd., Japan

[21] Appl. No.: 08/530,670

[22] Filed: Sep. 19, 1995

[30] Foreign Application Priority Data

Sep. 20, 1994 [JP] Japan .................................. 6-224760

[51] Int. Cl.⁶ .................................................. F25D 17/06
[52] U.S. Cl. ........................ 165/233; 165/231; 165/80.3; 236/44 R; 236/44 A; 62/176.6; 62/94; 361/695; 361/696
[58] Field of Search .................................. 165/80.3, 231, 165/233; 236/44 R, 44 A; 62/259.2, 94, 271, 176.1, 176.5, 176.6; 361/696, 695

[56] References Cited

U.S. PATENT DOCUMENTS

| | | |
|---|---|---|
| 3,504,736 | 4/1970 | Tausch . |
| 4,147,299 | 4/1979 | Freeman . |
| 4,495,545 | 1/1985 | DuFresne et al. . |
| 4,512,161 | 4/1985 | Logan et al. .............. 62/176.6 |
| 4,620,248 | 10/1986 | Gitzendanner ............ 236/44 R |
| 4,729,424 | 3/1988 | Mizuno et al. ............ 165/80.4 |
| 4,813,475 | 3/1989 | Couvrette ................. 165/48.1 |
| 5,052,472 | 10/1991 | Takahashi et al. ........ 165/80.4 |
| 5,136,856 | 8/1992 | Yamamoto et al. ....... 165/80.2 |
| 5,144,811 | 9/1992 | Brodie et al. ............. 62/259.2 |
| 5,210,680 | 5/1993 | Scheibler ................. 165/80.3 |
| 5,230,466 | 7/1993 | Moriya et al. ............ 236/44 A |
| 5,359,285 | 10/1994 | Hashinaga et al. ....... 165/80.3 |
| 5,361,188 | 11/1994 | Kondou et al. .......... 165/104.34 |
| 5,509,468 | 4/1996 | Lopez ...................... 165/80.3 |
| 5,582,235 | 12/1996 | Hamilton et al. ........ 165/80.3 |
| 5,697,223 | 12/1997 | Ishii et al. ............... 62/176.1 |

FOREIGN PATENT DOCUMENTS

| | | |
|---|---|---|
| 59-79599 | 5/1984 | Japan . |
| 1-112685 | 5/1989 | Japan .................... 236/44 A |
| 1-236699 | 9/1989 | Japan . |
| 3-252199 | 11/1991 | Japan . |
| 4-294597 | 10/1992 | Japan . |

*Primary Examiner*—John K. Ford
*Attorney, Agent, or Firm*—Evenson, McKeown, Edwards & Lenahan, P.L.L.C.

[57] ABSTRACT

A highly reliable electronic apparatus free from condensation in the cabinet of the apparatus. The electronic apparatus has printed circuit boards on which heat emitting semiconductor devices are mounted and a fan. The electronic apparatus further comprises a hygrometer for measuring the relative humidity and dew-point temperature of the cooling air that is introduced into the cabinet through an opening, a surface temperature sensor for sensing the temperature of the surface of the semiconductor devices, an internal temperature sensor for sensing the internal temperature of the semiconductor device, dehumidifier and heater means made up of a heat pump and an outdoor unit, and a controller for controlling the dehumidifier means and the heater means so that the relative humidity is less than 100% and the dew-point temperature is less than the surface temperature of the semiconductor devices.

7 Claims, 4 Drawing Sheets

AIR-COOLED ELECTRONIC APPARATUS WITH CONDENSATION PREVENTION

BACKGROUND OF THE INVENTION

The present invention relates to an electronic apparatus such as a computer, and in particular to a forced-air cooled electronic apparatus.

An electronic apparatus such as a computer houses a plurality of heat emitting semiconductor devices. Cooling these semiconductor devices is a requirement to get electronic performance from them. In its typical cooling method, the electronic apparatus is provided with a fan or blower within the cabinet of the apparatus to force external air to circulate within the cabinet.

Since cool external air is let in into the cabinet and then forced to circulate within the cabinet to cool the apparatus, the fed air can be moist air having some content of moisture. When the air has a relatively high moisture content, the cabinet suffers condensation. Condensation possibly causes the circuitry of the apparatus to short, leading to a fault such as the malfunction of the circuitry of the apparatus. If a semiconductor itself or printed circuit board suffers condensation, the risk of fault is more likely.

According to Japanese Patent Unexamined Publications No. 59-79599, No. 1-236699 and No. 3-252199, electronics are housed in a sealed container and dehumidifier means is used to lower humidity inside the container to prevent condensation. However, these prior art techniques are related to condensation prevention inside the sealed containers, where only mild condensation is expected. The prior art gives practically no consideration to condensation prevention in the forced air cooling method in which external cool air is taken in into the cabinet to cool the apparatus.

One prior art condensation prevention technique in the forced air cooling system has been disclosed by Japanese Patent Unexamined Publication No. 4-294597. According to this disclosure, a fan which is switched on at power-on of its host electronic apparatus circulates air. During power-off, the electronic apparatus is sealed in a container to prevent condensation and a hygroscopic compound such as silica gel is used to dehumidify the interior of the container. The fan is switched back on to take external air in. Circulated air that has exchanged heat with electronics is applied to the hygroscopic compound to recover its hygroscopicity performance.

Although the above prior art can prevent condensation during power-off, it gives no consideration to condensation that takes place during forced air cooling period.

It is an object of the present invention to prevent condensation during forced air cooling period.

SUMMARY OF THE INVENTION

To achieve the above object, the electronic apparatus according to the present invention, constructed of electronics made up of semiconductor devices housed in a cabinet and a fan to let external air in and then out of the cabinet, comprises heater means disposed upstream of the electronics in the flow of air for heating introduced air.

Furthermore, to achieve the above object, the electronic apparatus according to the present invention, constructed of electronics made up of semiconductor devices housed in a cabinet and a fan to let external air in and then out of the cabinet, comprises a hygroscopic compound disposed in the air flow path in the cabinet, sensor means for sensing humidity of the introduced air and temperature of the semiconductor devices, and means for reversing the direction of air flow by switching the direction of rotation of the fan in response to the output of the sensor means.

Condensation takes place chiefly in the following two ways. First, condensation occurs when a relative humidity or degree of saturation of the introduced air is 100%. In this case, part of moisture in the air cannot keep itself in vapor, and the cool air is introduced in a fog-like state and is likely to cause condensation inside the cabinet. Second, the temperature on the surface of a solid is lower than that of dew point of the introduced air. In the electronic apparatus, semiconductor devices and power supply are heating during use. Temperatures on the surface of electronics inside the cabinet rarely gets lower than the dew-point temperature of the introduced cool air. When the electronic apparatus is not in a steady state, however, like when it is switched on, condensation is likely to occur.

When the relative humidity of the introduced air is in excess of a specified one, a heater is operated to heat the cooling air. When the temperature of the cooling air is raised, moisture content allowed in the form of vapor in the cooling air is increased compared to that before heating. The relative humidity of the cooling air to the cabinet is thus kept below the specified one, and faults due to condensation are thus avoided.

When the surface temperature of the semiconductor devices is lower than the dew-point temperature of the introduced air, the heater is operated to heat the cooling air. The surface temperature of the semiconductor devices rises as the temperature of the cooling air rises. The surface temperature of the semiconductor devices is thus kept higher than the dew-point temperature of the cooling air. Faults due to condensation are thus avoided.

PREFERRED EMBODIMENTS OF THE INVENTION

Figure 1:
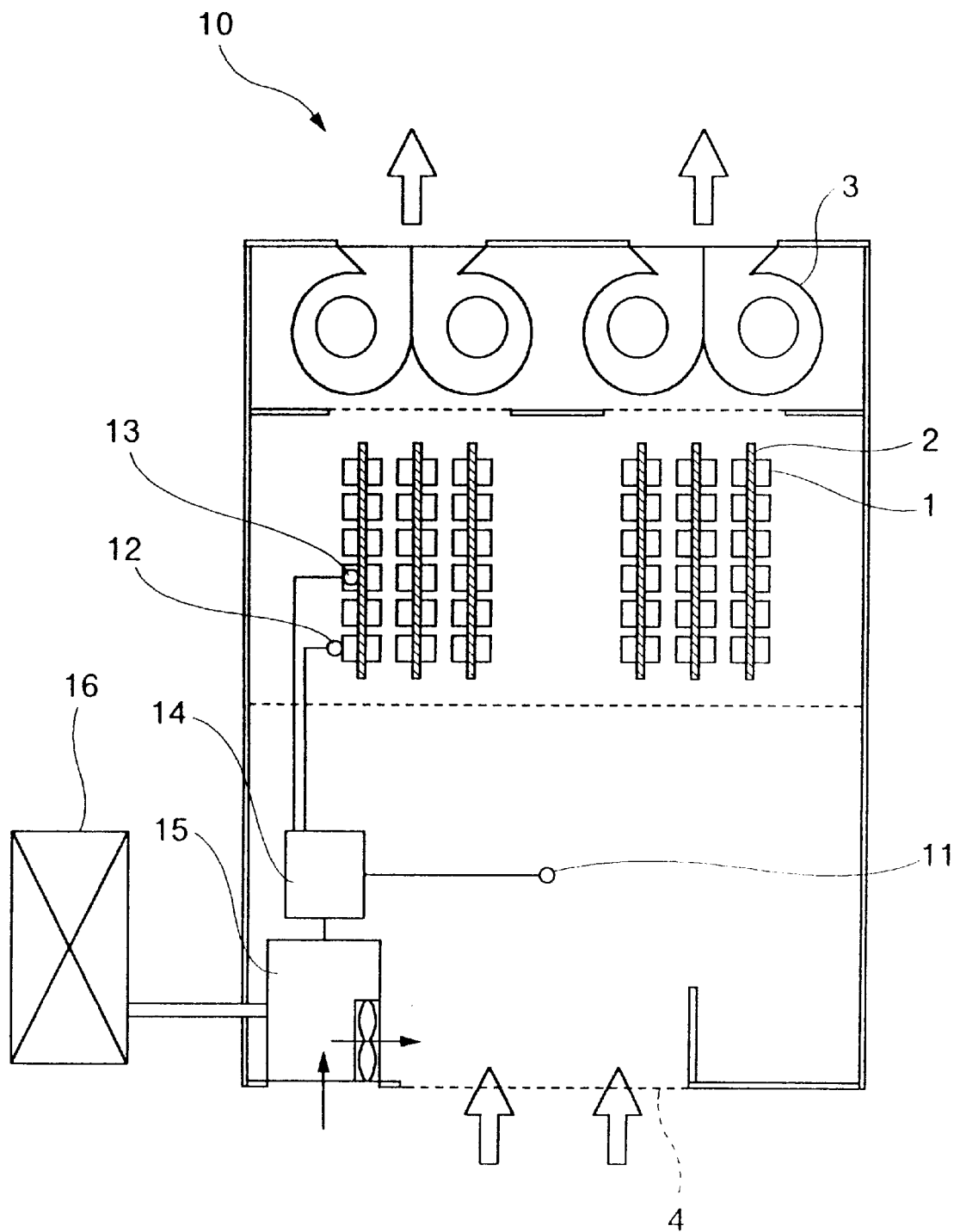
FIG. 1 is a vertical cross-sectional view showing the interior of the cabinet of the electronic apparatus according to the first embodiment of the present invention.

Referring to FIG. 1, the first embodiment of the present invention is now discussed. FIG. 1 is the vertical cross-sectional view showing the interior of the cabinet of the electronic apparatus or electronic apparatus system.

As shown, an electronic apparatus 10 houses, in its cabinet, printed circuit boards 2 on which heat emitting semiconductor devices 1 are mounted. Blowers 3 are mounted on the top portion of the cabinet. Cooling air is introduced through a bottom opening 4 and an air flow path in the bottom spacing of the cabinet from the outside of the cabinet, heat exchanged with the semiconductor devices 1 and the printed circuit boards 2, and then exhausted from the top side of the cabinet by the blowers 3.

In this embodiment, to prevent condensation, the electronic apparatus comprises a hygrometer 11, a surface temperature sensor 12 for sensing the surface temperature of the semiconductor devices 1, an internal temperature sensor 13 for the semiconductor devices 1, controller 14, and a heat pump 15. The heat pump 15 performs air-conditioning. The heat pump 15 is connected to an outdoor unit 16 via coolant piping, a drain and electric wiring. The outdoor unit 16 contains a compressor and a condenser to achieve cooling cycle. The hygrometer 11 is mounted near the bottom opening 4 upstream of the air flow path in order to measure the relative humidity and dew-point temperature of the cooling air. To measure the temperature of the surface of the semiconductor devices, the surface temperature sensor 12 is mounted on a place where condensation is likely to occur, for example, in the vicinity of a semiconductor that emits a modest amount of heat. To measure the internal temperature of a component, the internal temperature sensor 13 is mounted on a place where the most rigorous semiconductor reliability is required of, for example, in a semiconductor which emits a great deal of heat. According to the information given by the above three sensors, the controller 14 controls the heat pump 15 to prevent condensation inside the cabinet.

Discussed next is the control operation of the heat pump 15 under the control of the controller 14.

When a dry and wet bulb hygrometer as the hygrometer 11 is used, the dry bulb temperature and wet bulb temperature of the cooling air introduced into the cabinet are measured. The controller 14 determines the relative humidity or degree of saturation from the dry and wet bulb temperatures. When it exceeds 100%, the risk of condensation is high with moisture content in the air sticking to the semiconductor devices regardless of surface temperature of the semiconductor devices. It is necessary to operate the heat pump 15 to prevent condensation considering the surface temperature of the semiconductor devices. When the measured temperature by the internal temperature sensor 13 is lower than a specified temperature threshold beyond which the reliability of the semiconductor of interest is limited, namely, when the semiconductor has a sufficient temperature margin in heat sinking capability, the heat pump 15 is controlled for heating operation. The cooling air introduced into the cabinet is pre-heated in this way. The relative humidity is thus lowered and condensation is prevented.

On the other hand, when the temperature measured by the internal temperature sensor 13 is higher than the specified temperature threshold beyond which the reliability of the semiconductor of interest is limited, namely, when the semiconductor has no sufficient temperature margin in heat sinking capability, the heat pump 15 is controlled for cooling operation. If cooling operation only is activated in this case, both the relative humidity and temperature of the air are lowered. Thus, cooling operation only is not preferred in the standpoint of effectiveness and efficiency in the lowering of the relative humidity. The heat pump 15 thus alternates between cooling operation and heating operation properly to effectively keep the relative humidity below the specified one.

When the dew-point temperature of the cooling air measured by the hygrometer 11 is higher than the surface temperature of the semiconductor devices picked up by the surface temperature sensor 12, condensation is likely to take place. The heat pump 15 is thus operated to prevent condensation. When the dew-point temperature of the air is higher than the surface temperature of the semiconductor devices, the temperature of the air is higher than the surface temperature of the semiconductor devices. The semiconductors have thus a large temperature margin in heat sinking capability. The heat pump 15 is then switched to heating operation to heat the air and the semiconductor devices. The surface temperature of the semiconductor devices is driven high above the dew-point temperature of the air.

In this embodiment, heating and cooling (dehumidification) are alternately used. The reason for that follows.

When the heater heats the cooling air, the air temperature rises as the temperature of the semiconductor devices rises. This lowers the reliability of the semiconductor in terms of temperature. If the design of the semiconductors incorporates a sufficient temperature margin in heat sinking capability with a view to a temperature rise due to heating by the heater, the running cost of the computer increases resulting in a poor efficiency. Conversely, when the cooling operation is activated to dehumidify the cooling air, the temperature of the cooling air drops. The use of the cooling operation lowers the absolute humidity and temperature of the air. The relative humidity of the air does not change greatly as intended. If the relative humidity of the air is the chief cause for condensation, prevention of condensation is not enough.

In this embodiment, the cooling and heating operations properly alternate depending on the temperature of the introduced air and the temperature of the semiconductors. Thus, the above problem is resolved.

This embodiment thus incorporates the sensor means for sensing a moisture content of the humid air the cooling mechanism supplies to the electronic apparatus, dehumidifier means for keeping the moisture content below the specified value or heater means for evaporating the moisture content. Condensation in the electronic apparatus is prevented in an assured and effective manner with the thermal reliability of the semiconductor devices maintained regardless of change of conditions in the introduced air.

This embodiment also incorporates means for controlling the absolute humidity of the humid air below the absolute humidity of the saturated humid air that is at the temperature equal to the temperature of the representative surface of the electronic apparatus. Condensation in the electronic apparatus is thus prevented in an assured and effective manner with the thermal reliability of the semiconductor devices maintained regardless of change of conditions in the introduced air.

Therefore, the electronic apparatus according to the present invention prevents condensation in a reliable and efficient manner with the semiconductor reliability maintained.

In this embodiment, the internal temperature of the semiconductor device may be estimated from the surface temperature of the semiconductor provided by the surface temperature sensor 12. In this case, the internal temperature sensor 13 may be dispensed with and the component count is reduced.

In this embodiment, the relative humidity or degree of saturation of the cooling air in the electronic apparatus is controlled to be lower than 100%. The relative humidity or degree of saturation of the cooling air may be controlled to be below a certain threshold value below 100%, for example, 70%. Such an arrangement not only provides a sufficient margin in the prevention of condensation, but also controls the development of corrosion of the surface of metals. It should be noted that corrosion of metals is sharply accelerated when the relative humidity of the cooling air exceeds 70%. As the hygrometer 11, an electronic hygrometer employing a humidity sensor, or a hygrometer employing a humidity responsive element such as hair, may be used to sense the moisture content of the cooling air.

Figure 2:
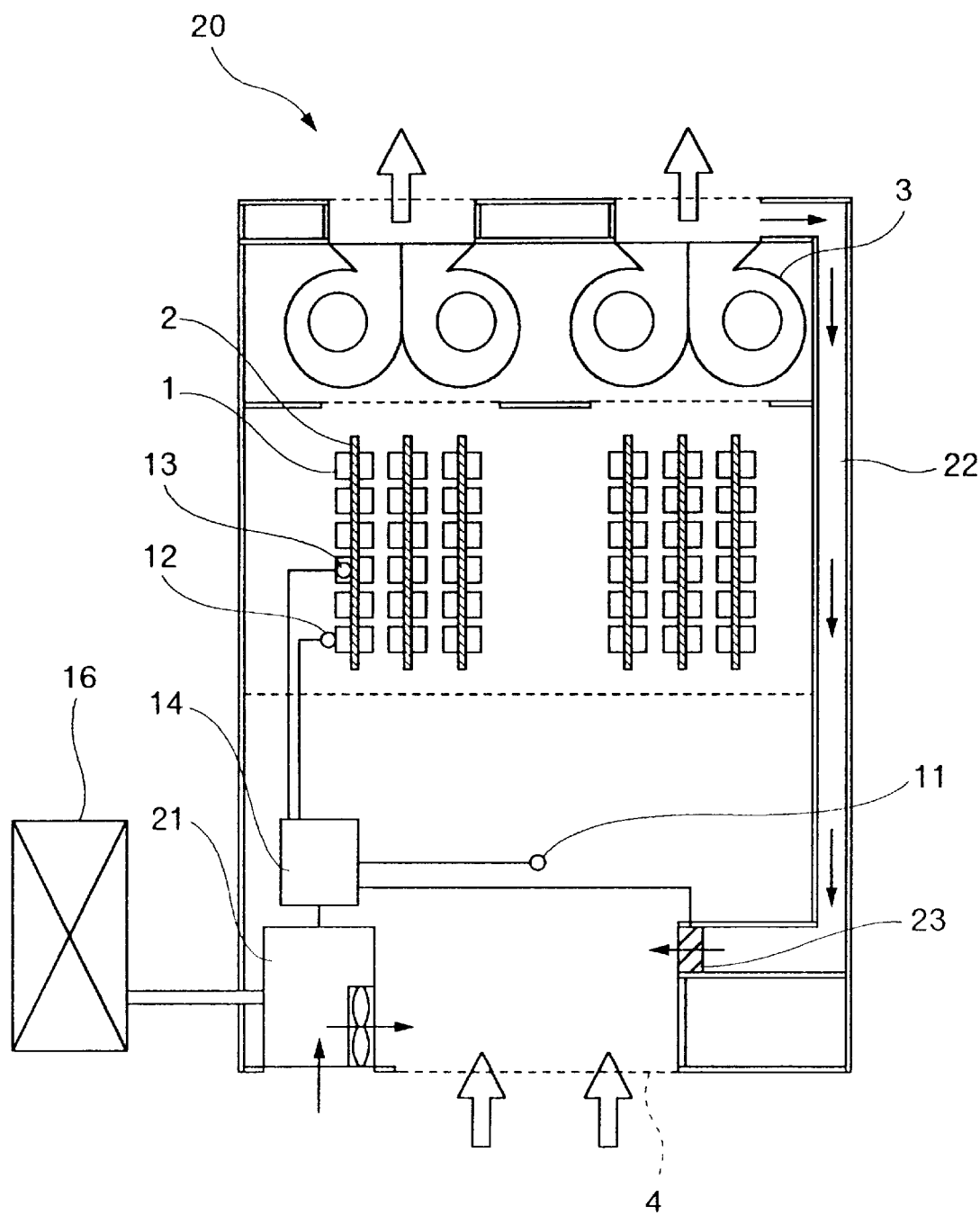
FIG. 2 is a vertical cross-sectional view showing the interior of the cabinet of the electronic apparatus according to the second embodiment of the present invention.

Referring to FIG. 2, the second embodiment of the present invention is now discussed. FIG. 2 is the vertical cross-sectional view of the electronic apparatus of the second embodiment.

As in the first embodiment, the electronic apparatus 20 according to the second embodiment comprises printed circuit boards 2 on which heat emitting semiconductor devices 1 are mounted, blowers 3, a hygrometer 11, a surface temperature sensor 12, an internal temperature sensor 13 and a controller 14.

As shown in FIG. 2, the second embodiment is provided with a cooler 21 in the cabinet. The cooler 21, working in normal cooling cycle, is connected via coolant piping, a drain and electric wiring to an outdoor unit 16 that houses a compressor and the like. Part of the air exhausted by the blowers 3 is fed back into the cabinet through a passage 22. A damper 23 is provided to open and close the passage 22. The controller 14 controls the damper 23 to open or close it. When the damper 23 is opened, part of the cooling air exhausted by the blowers 3 is fed back via the passage 22 to the upstream of the air flow of the apparatus near the opening 4. The air fed back is the one that has exchanged heat with the heat emitting semiconductors and printed circuit boards 2, and is higher in temperature than the cooling air newly introduced via the opening 4. Since the relatively high temperature air fed back and the introduced air are mixed, the resulting cooling air fed in the cabinet is preheated. The ratio of the feedback air and the introduced air is controlled by opening and closing the damper 23 and the blowers 3. The temperature and humidity of the cooling air is adjusted to proper levels by controlling the cooler 21. As in the first embodiment, condensation in the electronic apparatus is thus prevented in an assured and effective manner with the thermal reliability of the semiconductor devices maintained regardless of change of conditions in the introduced air.

Figure 3:
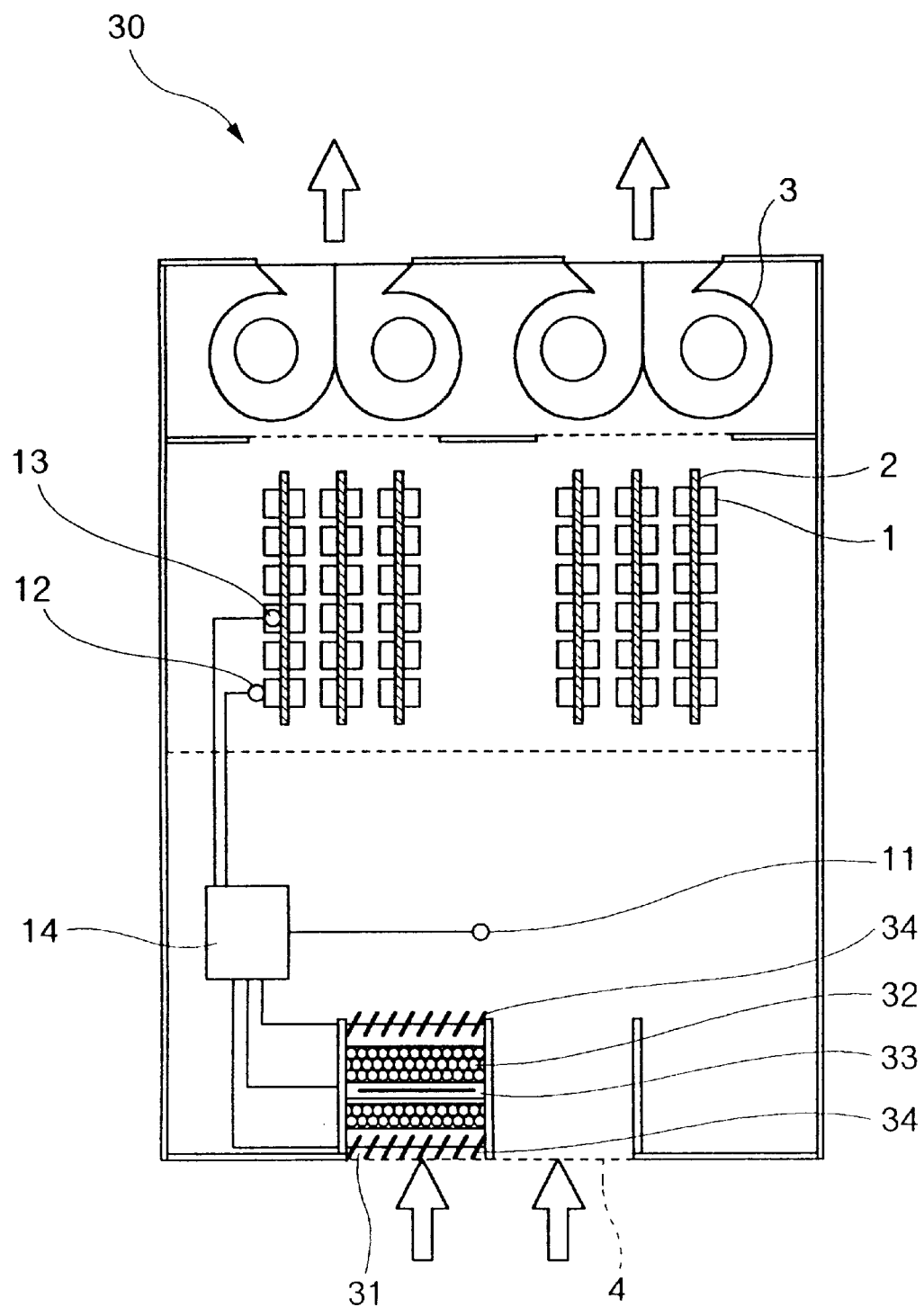
FIG. 3 is a vertical cross-sectional view showing the interior of the cabinet of the electronic apparatus according to the third embodiment of the present invention.

Referring to FIG. 3, the third embodiment of the present invention is discussed. FIG. 3 is the vertical cross-sectional view showing the electronic apparatus.

As in the first embodiment, the electronic apparatus 30 according to the third embodiment comprises printed circuit boards 2 on which heat emitting semiconductor devices 1 are mounted, blowers 3, a hygrometer 11, a surface temperature sensor 12, an internal temperature sensor 13 and a controller 14.

As shown in FIG. 3, in the third embodiment, the external cooling air is introduced via a dehumidifier passage 31 and the opening 4 as well. The dehumidifier passage 31 is loaded with a hygroscopic compound 32 such as silica gel. Also disposed there is an electric heater 33. The inlet port of the dehumidifier passage 31 is provided with a damper 34. The controller 14 controls the damper 34 to open and close it.

During use, the electronic apparatus 30 closes the damper 34 to let the cooling air in through the opening 4. When the possibility of condensation is high, namely, the hygrometer 11 determines that the relative humidity of the cooling air reaches 100%, or the surface temperature of the semiconductor devices given by the surface temperature sensor 12 is lower than the dew-point temperature given by the hygrometer 11, the damper 34 is opened to let the external cooling air in through the dehumidifier passage 31. A determination is made of whether the semiconductor devices have a margin in heat sinking capability, from the temperature provided by the internal temperature sensor 13. When the determination reveals no margin, the heater 33 is stopped. The moisture content in the cooling air that has passed through the dehumidifier passage is absorbed by the hygroscopic compound 32. Both the absolute and relative humidities of the cooling air are lowered. Condensation is thus prevented. When there is still a temperature margin, the heater 33 is continuously left to heat the cooling air. The cooling air is heated, causing the relative humidity to drop and the surface temperature of the semiconductor devices to rise. Condensation is thus prevented.

When the possibility of condensation is low in the operation of the electronic apparatus 30, namely, when the relative humidity of the cooling air is less than 100% and when the surface temperature of the semiconductor devices is higher than the dew-point temperature, the damper 34 is opened with the heater 33 operated in order to remove moisture from the hygroscopic compound 32. When heated by the heater 33, the hygroscopic compound 32 gives off moisture once absorbed and recovers its active state. The hygroscopic compound 32 is thus used for a long time with no need for replacement.

Figure 4:
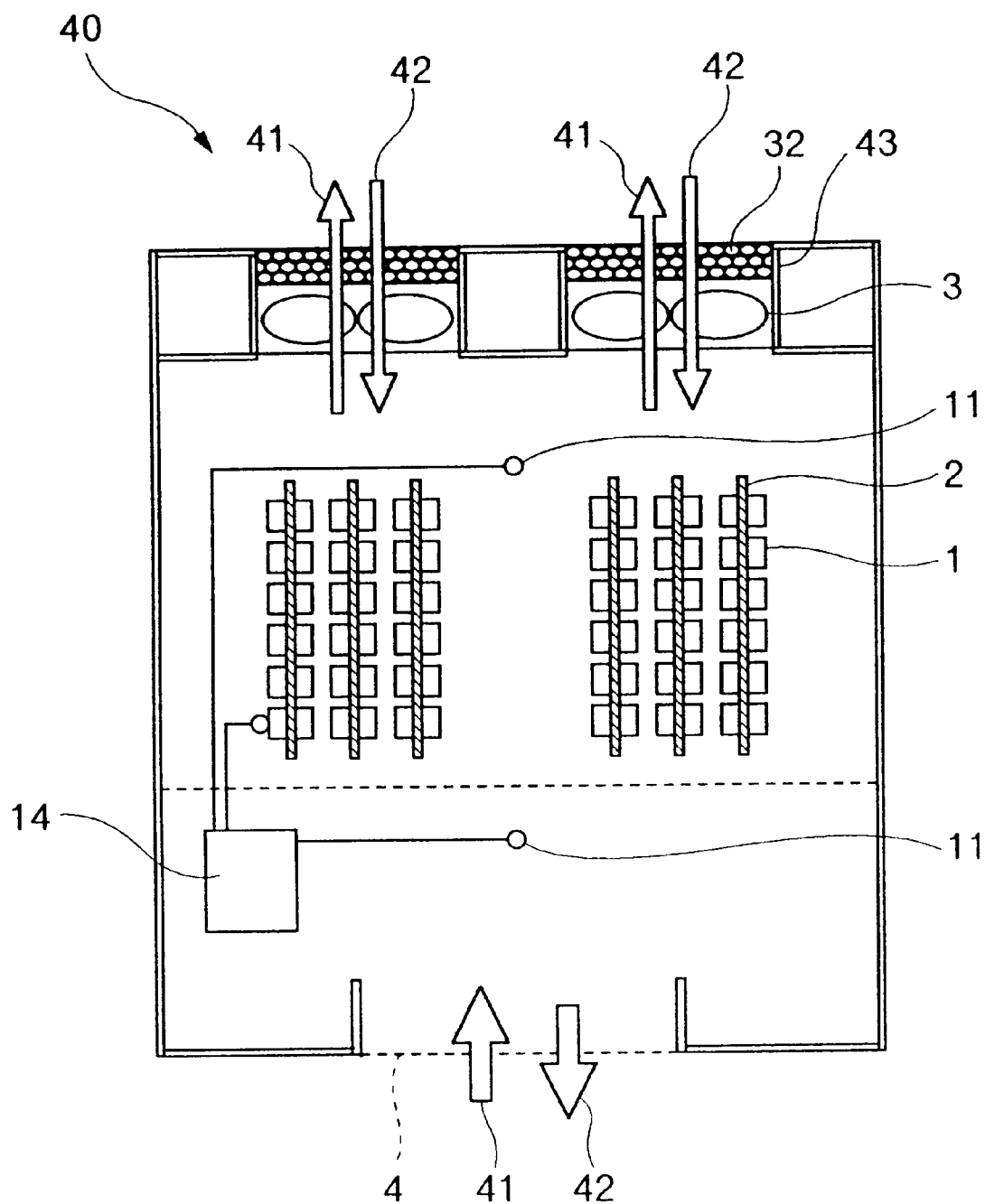
FIG. 4 is a vertical cross-sectional view showing the interior of the cabinet of the electronic apparatus according to the fourth embodiment of the present invention.

Referring to FIG. 4, the fourth embodiment of the present invention is now discussed. FIG. 4 is the cross-sectional view showing the interior of the electronic apparatus.

As in the first embodiment, the electronic apparatus 40 according to the fourth embodiment comprises printed circuit boards 2 on which heat emitting semiconductor devices 1 are mounted, blowers 3, hygrometers 11, a surface temperature sensor 12, an internal temperature sensor 13 and a controller 14.

In this embodiment, the blowers 3 have the switching capability of the direction of air flow as represented by arrows 41, 42. If axial-flow type fans are used as the blowers 3, the direction of air flow is easily reversed by switching the direction of rotation of the fans. Dehumidifier units 43 filled with the hygroscopic compound 32 such as silica gel are disposed at the ports of the blowers 3 opened to the outside. During normal use of the electronic apparatus 40, the air is exhausted in the direction of the arrow 41. The air exhausted by the blowers 3 that has already been heated by the heat emitting semiconductor devices 1 heats the hygroscopic compound 32 loaded in the dehumidifier units 43 to its active state. When the possibility of condensation is high, the blowers 3 are rotated in their reverse direction to allow the cooling air to flow in the direction of the arrow 42. Thus, the cooling air is dehumidified by the dehumidifier units 43 before reaching the semiconductor devices. Condensation is thus prevented.

In this embodiment, hygrometers 11 for measuring the relative humidity and dew-point temperature of the cooling air are mounted in two separate locations as shown in FIG. 4. In either direction of air flow, one of the hygrometers 11 is designed to measure the cooling air before its temperature rise due to heat exchange with the semiconductor devices 1, upstream of the heat emitting semiconductor devices 1.

As discussed above referring to FIGS. 1 through 4, the electronic apparatus according to each of the embodiments prevents condensation in an assuredly and efficient manner with the thermal reliability of the semiconductor devices maintained under a diversity of conditions of the cooling air.

According to the present invention, the relative humidity or degree of saturation of the cooling air is kept below 100%. Condensation in the electronic apparatus is prevented with the semiconductor devices controlled to a temperature below a specified value.

According to the present invention, the relative humidity or degree of saturation of the cooling air is kept below 70%. Condensation in the electronic apparatus is prevented with the semiconductor devices controlled to a temperature below a specified value.

What is claimed is:

1. An electronic apparatus comprising:

a plurality of semiconductor devices;

a cabinet enclosing said semiconductor devices;

a fan to introduce an air flow of external air into the cabinet through a first air inlet, which air flow directly contacts said semiconductor devices;

a humidity sensor for measuring relative humidity of the air flow;

a temperature sensor for measuring a temperature of the semiconductor devices;

a heater disposed in said air flow through said first air inlet, upstream of the semiconductor devices for heating the air flow in response to measured values of said sensors; and a second air inlet disposed in parallel fluid flow with said first air inlet;

wherein said temperature sensor comprises means for determining an internal temperature of the semiconductor devices.

2. An electronic apparatus comprising:

a plurality of semiconductor devices;

a cabinet enclosing said semiconductor devices;

a fan to introduce an air flow of external air into the cabinet through a first air inlet, which air flow directly contacts said semiconductor devices;

a sensor for measuring relative humidity of the air flow;

a sensor for measuring temperature of the semiconductor devices;

a heater disposed in said air flow through said first air inlet, upstream of the semiconductor devices for heating the air flow;

a dehumidifier comprising a hygroscopic compound for dehumidifying air introduced through said first air inlet upstream of the semiconductor devices in the flow of air;

a second air inlet disposed in parallel fluid flow with said first air inlet; and means for controlling one of the heater and the dehumidifier in response to an output of said sensors;

wherein said sensor for measuring temperature includes a sensor for measuring an internal temperature of the semiconductor devices.

3. The electronic device according to claim 2, wherein dehumidifier includes opening/closing means for regulating an air flow through said heater and said hygroscopic compound.

4. An arrangement for controlling temperature and humidity in an electronic unit having a plurality of semiconductor devices enclosed in a housing, said arrangement comprising:

a first air inlet for guiding a flow of air into said housing;

a second air inlet for guiding a flow of air into said housing;

a heating component disposed in said second air inlet;

a dehumidifier component disposed in said second air inlet in sequence with said heating component;

a damper for controlling a relative flow of air through said first and second inlets;

a sensor arrangement for sensing temperature and relative humidity of air flow through said first and second air inlet and for sensing a temperature of said semiconductor devices; and a controller for controlling said heating component and said damper in response to outputs from said sensor arrangement.

5. The arrangement according to claim 4 wherein, when said relative humidity reaches a preset value, or when said temperature of the semiconductor devices is lower than a dew point temperature of air in said air flow, said controller opens said damper, allowing external air to flow through the dehumidifier component.

6. The arrangement according to claim 5 wherein:

when a temperature of said semiconductor devices is less than a predetermined value, said controller activates said heating component to continuously heat said flow of air through said second air inlet; and when the temperature of the semiconductor devices is greater than a predetermined value, said controller deactivates said heating component.

7. The arrangement according to claim 6 wherein when said relative humidity is less than said preset value, and when the temperature of the semiconductor devices is above said dew point temperature, said controller causes said damper to open and said heating component to operate.

* * * * *